United States Patent
Masuda et al.

(10) Patent No.: US 12,193,189 B2
(45) Date of Patent: Jan. 7, 2025

(54) PORTABLE ELECTRONIC DEVICE

(71) Applicant: SONY GROUP CORPORATION, Tokyo (JP)

(72) Inventors: Kiyohito Masuda, Tokyo (JP); Kosuke Kuwahara, Tokyo (JP)

(73) Assignee: SONY GROUP CORPORATION, Tokyo (JP)

(*) Notice: Subject to any disclaimer, the term of this patent is extended or adjusted under 35 U.S.C. 154(b) by 147 days.

(21) Appl. No.: 17/774,950

(22) PCT Filed: Nov. 15, 2019

(86) PCT No.: PCT/JP2019/044938
§ 371 (c)(1),
(2) Date: May 6, 2022

(87) PCT Pub. No.: WO2021/095255
PCT Pub. Date: May 20, 2021

(65) Prior Publication Data
US 2022/0394874 A1 Dec. 8, 2022

(51) Int. Cl.
*H05K 7/20* (2006.01)
*H04M 1/02* (2006.01)

(52) U.S. Cl.
CPC ....... *H05K 7/2039* (2013.01); *H05K 7/20336* (2013.01); *H04M 1/026* (2013.01)

(58) Field of Classification Search
CPC .. H05K 7/2039; H05K 7/20336; H04M 1/026
See application file for complete search history.

(56) References Cited

U.S. PATENT DOCUMENTS

| | | | |
|---|---|---|---|
| 2017/0062899 A1 | 3/2017 | Takahashi et al. | |
| 2020/0367386 A1* | 11/2020 | Kim | H05K 7/20436 |
| 2021/0105909 A1* | 4/2021 | Ide | H04N 23/667 |
| 2021/0410268 A1* | 12/2021 | Moon | G06F 1/203 |

FOREIGN PATENT DOCUMENTS

| | | |
|---|---|---|
| CN | 107004939 A | 8/2017 |
| CN | 107027266 A | 8/2017 |
| CN | 107408754 A | 11/2017 |
| JP | 2008-187337 A | 8/2008 |
| JP | 2016-045399 A | 4/2016 |

(Continued)

OTHER PUBLICATIONS

International Search Report and Written Opinion of PCT Application No. PCT/JP2019/044938, issued on Jan. 7, 2020, 08 pages of ISRWO.

(Continued)

*Primary Examiner* — Mukundbhai G Patel
(74) *Attorney, Agent, or Firm* — CHIP LAW GROUP

(57) ABSTRACT

A portable electronic device includes a housing, an antenna module that is disposed in the vicinity of an inner surface of the housing with a gap from the inner surface, and a first heat diffusion member that is provided in the housing to be separated from the inner surface of the housing and is thermally connected to the antenna module. A path through which heat generated by the antenna module is transferred along the first heat diffusion member, is separated from the inner surface of the housing.

13 Claims, 6 Drawing Sheets

(56) References Cited

FOREIGN PATENT DOCUMENTS

| JP | 2017-046215 A | 3/2017 |
| JP | 2018-114878 A | 7/2018 |
| JP | 2019-106690 A | 6/2019 |
| WO | 2019/103485 A1 | 5/2019 |

OTHER PUBLICATIONS

Office Action for CN Patent Application No. 201980102044.6, issued on Oct. 14, 2024, 06 pages of English Translation and 06 pages of Office Action.

* cited by examiner (A-A)

(B-B)

PORTABLE ELECTRONIC DEVICE

CROSS REFERENCE TO RELATED APPLICATIONS

This application is a U.S. National Phase of International Patent Application No. PCT/JP2019/044938 filed on Nov. 15, 2019. Each of the above-referenced applications is hereby incorporated herein by reference in its entirety.

FIELD

The present disclosure relates to a portable electronic device.

BACKGROUND

For example, in a smartphone as a portable electronic device, for example, a millimeter-wave module compatible with a frequency band of 30 to 300 GHz is provided in a housing as an antenna module, and the antenna module is disposed in the vicinity of an outer peripheral portion of the housing, thereby enhancing communication characteristics.

CITATION LIST

Patent Literature

Patent Literature 1: JP 2019-106690 A

SUMMARY

Technical Problem

As described above, since the antenna module is disposed in the vicinity of the inner surface in the housing in order to enhance communication characteristics, heat generated by the antenna module at the time of using the antenna module, is easily transferred to the surface of the housing, and there is a possibility that the user of the portable electronic device feels the heat of the surface of the housing. In particular, in a case where the housing is formed of a material having high thermal conductivity such as a metal chassis, heat is easily transferred from the antenna module to the housing, so that the user noticeably feels the heat on the surface of the housing. In order to avoid such inconvenience, it is conceivable to perform control to restrict the operation of the portable electronic device, and finally stop the portable electronic device, but the convenience of the portable electronic device is impaired.

Thus, the present disclosure proposes a portable electronic device capable of preventing heat of an antenna module from being transferred to a surface of a housing of the portable electronic device.

Solution to Problem

According to the present disclosure, a portable electronic device includes: a housing; an antenna module that is disposed in a vicinity of an inner surface of the housing with a gap from the inner surface; and a first heat diffusion member that is provided in the housing to be separated from the inner surface of the housing and is thermally connected to the antenna module, wherein a path through which heat generated by the antenna module is transferred along the first heat diffusion member, is separated from the inner surface of the housing.

DESCRIPTION OF EMBODIMENTS

Hereinafter, embodiments of the present disclosure will be described in detail with reference to the drawings. Note that the portable electronic device of the present disclosure is not limited by the following embodiments.

First Embodiment

Figure 1:
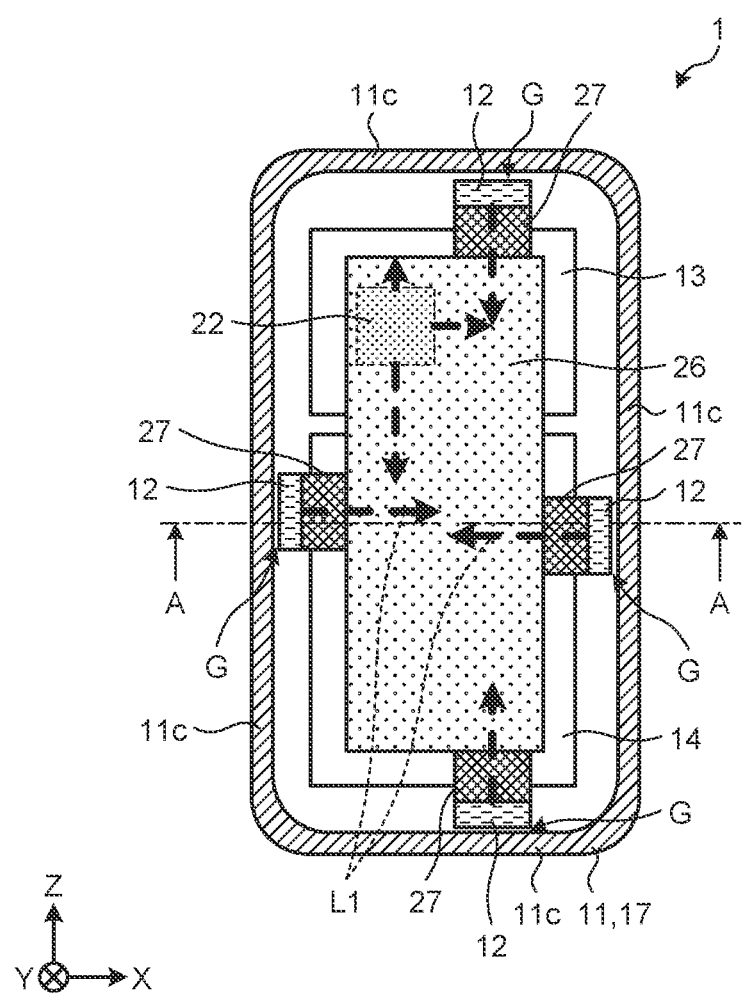
FIG. 1 is a perspective plan view illustrating a portable electronic device according to a first embodiment from the back side.
Figure 2:
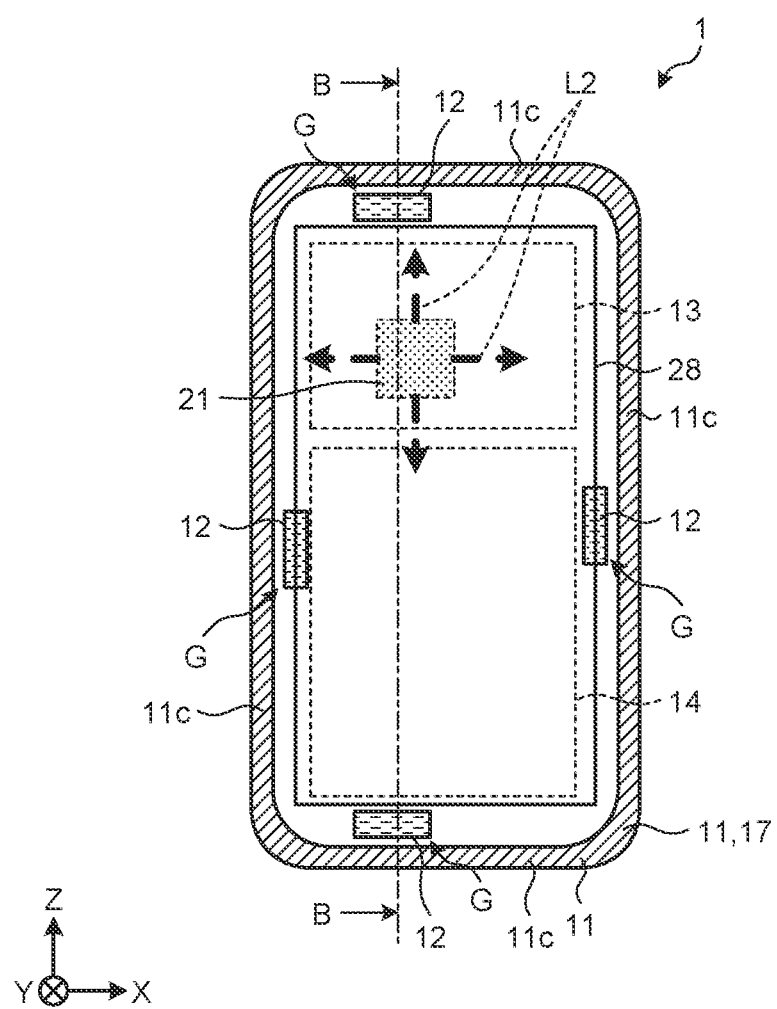
FIG. 2 is a perspective plan view illustrating the portable electronic device according to the first embodiment from the front side.

FIG. 1 is a perspective plan view illustrating a portable electronic device according to a first embodiment from the back side. FIG. 2 is a perspective plan view illustrating the portable electronic device according to the first embodiment from the front side. As illustrated in FIGS. 1 and 2, a portable electronic device 1 according to the first embodiment is configured as a so-called smartphone. The portable electronic device 1 includes a housing 11, a plurality of antenna modules 12 that is disposed in the housing 11, a circuit board 13 that is electrically connected to the plurality of antenna modules 12, and a battery 14 that supplies power to the circuit board 13.

Figure 3:
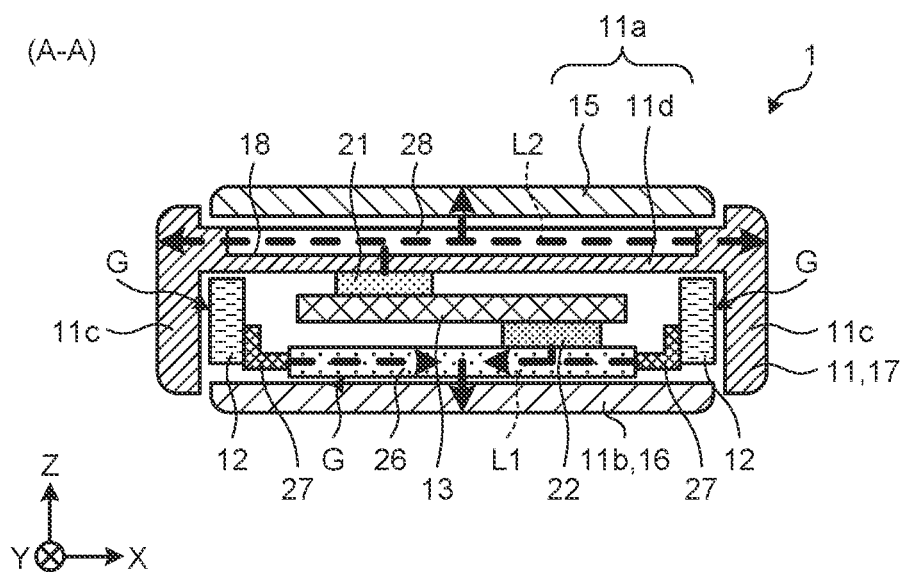
FIG. 3 is a cross-sectional view illustrating the portable electronic device according to the first embodiment taken along line A-A.
Figure 4:
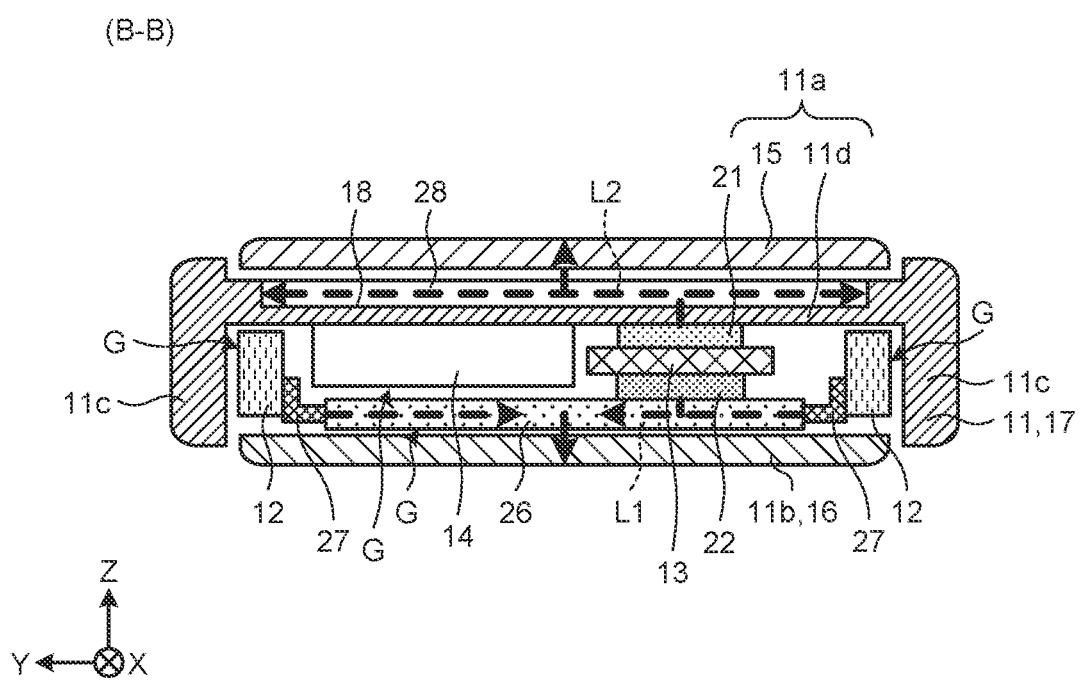
FIG. 4 is a cross-sectional view illustrating the portable electronic device according to the first embodiment taken along line B-B.

FIG. 3 is a cross-sectional view of the portable electronic device 1 according to the first embodiment taken along line A-A. FIG. 4 is a cross-sectional view of the portable electronic device 1 according to the first embodiment taken along line B-B. As illustrated in FIGS. 1, 2, 3, and 4, the housing 11 is formed in a flat rectangular parallelepiped shape, and includes a pair of main surface portions 11a and 11b having rectangular shapes, and four side surface portions 11c that are connected to one main surface portion 11a of the pair of main surface portions 11a and 11b. The one main surface portion 11a of the pair of main surface portions 11a and 11b is the front surface portion, and corresponds to a support portion 11d that supports a liquid crystal display panel 15 incorporated in the housing 11. In the present disclosure, the main surface portion 11a (front surface portion) of the housing 11 includes the support portion 11d and the liquid crystal display panel 15, but is not limited to the configuration including the liquid crystal display panel 15. Instead of the liquid crystal display panel 15, a flat plate-shaped main surface portion 11a continuous from the side surface portions 11c, may be provided. The other main surface portion 11b of the pair of main surface portions 11a and 11b is the back surface portion, and corresponds to a back surface panel 16 constituting the housing 11. The four side surface portions 11c include two pairs of side surface portions 11c facing each other.

Figure 5:
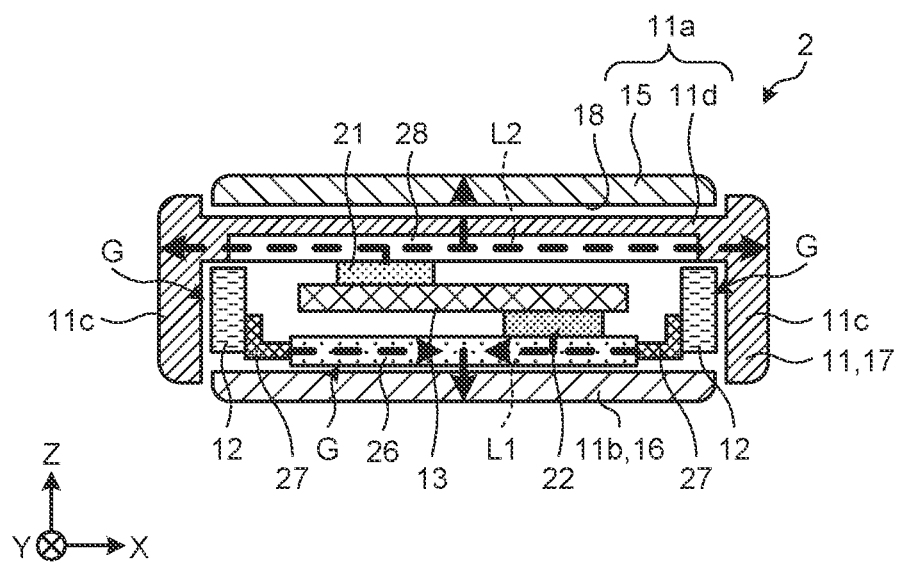
FIG. 5 is a cross-sectional view illustrating main parts of a portable electronic device according to a second embodiment.

Note that, in the housing 11 of the portable electronic device 1, each diagram is illustrated with the short side direction of the rectangular main surface portions 11a and 11b as an X direction, the long side direction of the main surface portions 11a and 11b as a Y direction, and the thickness direction of the housing 11 as a Z direction. Similarly, X, Y, and Z directions of the housing 11 are illustrated in FIG. 5 and subsequent drawings.

In addition, the housing 11 according to the first embodiment includes a chassis member 17, in which the support portion 11d that supports the liquid crystal display panel 15, and the four side surface portions 11c, are integrally formed. In other words, the housing 11 according to the first embodiment includes the chassis member 17, the liquid crystal display panel 15, and the back surface panel 16. Note that the housing 11 is not limited to the configuration including the chassis member 17, and may be formed as a case (not illustrated) having an internal space.

The chassis member 17 of the housing 11 is formed of, for example, a metal material, but may be partially formed of a resin material. The back surface panel 16 is formed of, for example, a glass material, but may be formed of a resin material or a metal material. In addition, in the chassis member 17, a recessed portion 18, in which a third heat diffusion member 28 described later is incorporated, is formed so as to face the liquid crystal display panel 15. Note that the structure of the chassis member 17 is not limited to the structure including the recessed portion 18, and the third heat diffusion member 28 may be attached along the flat portion of the chassis member 17.

The antenna modules 12 of the portable electronic device 1 are communication modules with built-in antennas, and for example, millimeter-wave modules compatible with the 5th generation mobile communication system (hereinafter referred to as 5G) are used. As illustrated in FIGS. 1 and 2, the four antenna modules 12 are disposed in the vicinities of the centers of each of the two pairs of side surface portions 11c in the housing 11. In addition, each antenna module 12 is supported by the circuit board 13 (not illustrated), and as illustrated in FIGS. 3 and 4, is disposed in the vicinity of the inner surface of each side surface portion 11c of the housing 11 with a predetermined gap G from the inner surface of each side surface portion 11c. The gap G functions as a heat insulating space between the antenna module 12 and the inner surface of the housing 11, and heat of the antenna module 12 is prevented from being transferred to the housing 11. The gap G is less than 1 mm, and is formed to be, for example, about 0.5 mm.

Note that the gap G between each antenna module 12 and the inner surface of each side surface portion 11c of the housing 11, is preferably provided with the gap G over the entire region between the antenna module 12 and the inner surface of the side surface portion 11c. However, for example, the gap G may be partially provided between the antenna module 12 and the inner surface of the side surface portion 11c, by abutting a resin protruding portion that is provided on the inner surface of the side surface portion 11c, against the outer peripheral surface of the antenna module 12. That is, the gap G in the present disclosure includes a structure in which the gap G is provided entirely or partially between the antenna module 12 and the inner surface of the side surface portion 11c.

In addition, a heat insulating material (not illustrated) may be provided in the gap G between the antenna module 12 and the inner surface of each side surface portion 11c of the housing 11, so that heat of the antenna module 12 can be prevented from being transferred to the side surface portion 11c of the housing 11.

Note that the portable electronic device of the present disclosure is not limited to the configuration including four antenna modules 12, and may have a configuration including at least one antenna module 12.

Various electronic elements including an integrated circuit 21 as a first heat generating element, and a wireless communication circuit 22 as a second heat generating element, are mounted on the circuit board 13 of the portable electronic device 1, and are supported by the support portion (not illustrated) of the chassis member 17. The integrated circuit 21 is, for example, a central processing unit (CPU), and is disposed on one surface (main surface portion 11a side) of the circuit board 13 facing the chassis member 17. The wireless communication circuit 22 is, for example, a radio frequency integrated circuit (RFIC), and is disposed on the other surface (main surface portion 11b side) of the circuit board 13 facing a first heat diffusion member 26 described later. Regarding the circuit board 13, as illustrated in FIGS. 1 and 2, the outer peripheral portions of the circuit board 13 are disposed to be separated from the inner surfaces of the housing 11, and the integrated circuit 21 and the wireless communication circuit 22 are also disposed to be separated from the inner surfaces of the housing 11.

Note that the number of circuit boards 13 is not limited to one, and two or more circuit boards may be stacked. In this case, a stacked structure in which circuit boards with various components mounted on both surfaces are stacked like a so-called two-story board, or a stacked structure, in which circuit boards are connected via a through hole or the like like a so-called multilayer board, is included. In addition, the arrangement of the integrated circuit 21 and the wireless communication circuit 22 on the circuit board 13, is not limited, and contrary to the arrangement according to the first embodiment, the wireless communication circuit 22 may be disposed on the main surface portion 11a side (liquid crystal display panel 15 side) of the circuit board 13, and the integrated circuit 21 may be disposed on the main surface portion 11b side (back surface panel 16 side) of the circuit board 13.

The battery 14 is formed in a rectangular parallelepiped shape, and is disposed along the back surface of the circuit board 13 facing the back surface panel 16. As the battery 14, for example, a secondary battery such as a lithium ion battery is used. As illustrated in FIGS. 1 and 4, the battery 14 is attached to the support portion 11d of the chassis member 17 on the back surface panel 16 side, and a gap G is ensured between the battery and the first heat diffusion member 26 described later.

Main Parts of First Embodiment

As illustrated in FIGS. 1, 3, and 4, the portable electronic device 1 includes the first heat diffusion member 26 and second heat diffusion members 27 that transfer heat generated by the antenna modules 12, and the third heat diffusion member 28 that transfers heat generated by the integrated circuit 21 on the circuit board 13.

As illustrated in FIGS. 1 and 3, the first heat diffusion member 26 is thermally connected to the antenna modules 12. The first heat diffusion member 26 is provided in the housing 11, and is fastened and supported by the support portion 11d of the chassis member 17 by a screw (not illustrated) or the like. Regarding the first heat diffusion member 26, the outer peripheral portions of the first heat diffusion member 26 is disposed to be separated from the inner surfaces of the side surface portions 11c of the housing 11, so that the heat of the first heat diffusion member 26 is prevented from being transferred to the side surface portions 11c. The first heat diffusion member 26 is disposed to be separated from the support portion 11d of the chassis member 17 included in the main surface portion 11a of the housing 11. In addition, the first heat diffusion member 26 is disposed along the inner surface of the back surface panel 16 forming the one main surface portion 11b while being separated from the inner surface of the main surface portion 11b of the housing 11, and a predetermined gap G is ensured between the first heat diffusion member 26 and the inner surface of the back surface panel 16. As a result, the gap G functions as a heat insulating space between the first heat diffusion member 26 and the inner surface of the back surface panel 16, and heat is prevented from being transferred from the first heat diffusion member 26 to the back surface panel 16. Therefore, paths, through which the heat generated by the antenna modules 12 is transferred along the first heat diffusion member 26, are separated from the inner surfaces of the housing 11. The gap G between the first heat diffusion member 26 and the inner surface of the back surface panel 16, is less than 1 mm, and is formed to be, for example, about 0.5 mm.

In addition, as illustrated in FIGS. 3 and 4, the wireless communication circuit 22 on the circuit board 13 is thermally connected to the first heat diffusion member 26. The wireless communication circuit 22 is provided so as to be in contact with the first heat diffusion member 26 via an inclusion (not illustrated) having thermal conductivity, such as a thermal interface material (TIM) or a metal radio wave protection shield material. Similarly, the integrated circuit 21 on the circuit board 13 is thermally connected to the chassis member 17, and is provided so as to be in contact with the chassis member 17 via an inclusion having thermal conductivity. Note that, for example, heat dissipation grease or the like may be filled between the wireless communication circuit 22 and the first heat diffusion member 26, and between the integrated circuit 21 and the chassis member 17 to improve thermal conductivity. In addition, each arrangement of the integrated circuit 21 and the wireless communication circuit 22 is not limited to the first embodiment, and the integrated circuit 21 may be disposed in contact with the first heat diffusion member 26, and the wireless communication circuit 22 may be disposed in contact with the chassis member 17.

As the first heat diffusion member 26, for example, any one member of a sheet-like heat dissipation material such as a graphite sheet, a graphene sheet, or a metal plate (heat dissipation plate metal) such as a copper material, a heat dissipation structure such as a vapor chamber, a heat pipe, or a heat sink, or a composite member obtained by combining a plurality of these members is used, and high thermal conductivity is ensured. In addition, as the first heat diffusion member 26, the battery 14 described above may be used. In this case, the outer peripheral portions of the battery 14 are thermally connected to the antenna modules 12 via the second heat diffusion members 27.

The second heat diffusion members 27 are provided in the housing 11, and are thermally connected to the antenna modules 12 and the first heat diffusion member 26. As illustrated in FIGS. 3 and 4, such a second heat diffusion member 27 is formed in a shape with, for example, an L-shaped cross section, and has one end connected to an antenna module 12 and the other end connected to an end surface of an outer peripheral portion of the first heat diffusion member 26. Note that the shape of the second heat diffusion member 27 is not limited, and the second heat diffusion member 27 formed in a flat plate shape and an end surface of an antenna module 12 may be connected to each other so as to be in surface contact with each other. The second heat diffusion member 27 is separated from the side surface portion 11c which is the inner surface of the housing 11 and the inner surface of the back surface panel 16, and heat is prevented from being transferred to the surface of the housing 11. In addition, since the first heat diffusion member 26 is thermally connected to the antenna modules 12 via the second heat diffusion members 27, the antenna modules 12 and the first heat diffusion member 26 can be easily thermally connected without complicating the shape of the first heat diffusion member 26.

As each second heat diffusion member 27, for example, any one member of a sheet-like heat dissipation material such as a graphite sheet, a graphene sheet, or a metal plate such as a copper material, or a heat dissipation structure such as a heat pipe, or a composite member obtained by combining a plurality of these members is used, and high thermal conductivity is ensured. In the first embodiment, as an example, the graphite sheet as the first heat diffusion member 26 is thermally connected to each antenna module 12 via the graphite sheet as each second heat diffusion member 27.

The third heat diffusion member 28 is incorporated in the recessed portion 18 of the chassis member 17, and is disposed to be separated from the inner surfaces of the side surface portions 11c of the housing 11. The third heat diffusion member 28 is provided in contact with the inner surface of the recessed portion 18, and heat generated by the integrated circuit 21 on the circuit board 13 is transferred to the third heat diffusion member 28 via the chassis member 17. As described above, the integrated circuit 21 as the first heat generating element is thermally connected to the third heat diffusion member 28. Note that the third heat diffusion member 28 is not limited to the structure in which the third heat diffusion member 28 is incorporated in the recessed portion 18 of the chassis member 17 as described above, and may be attached along the flat portion of the chassis member 17.

As the third heat diffusion member 28, for example, any one member of a sheet-like heat dissipation material such as a graphite sheet, a graphene sheet, or a metal plate such as a copper material, a heat dissipation structure such as a vapor chamber, a heat pipe, or a heat sink, or a composite member obtained by combining a plurality of these members is used, and high thermal conductivity is ensured.

Note that, in the first embodiment, the antenna modules 12 are indirectly thermally connected to the first heat diffusion member 26 via the second heat diffusion members 27, but the present invention is not limited to this structure. The antenna modules 12 may be directly connected to the first heat diffusion member 26 without using the second heat diffusion members 27 as in the third embodiment (FIG. 6) described later.

(Flow of Heat of Antenna Modules)

As illustrated in FIGS. 1 to 4, in the portable electronic device 1 according to the first embodiment, heat generated by the antenna modules 12 is transferred to the second heat diffusion members 27, and is transferred to the first heat diffusion member 26 via the second heat diffusion members 27. The heat, which is transferred from the antenna modules 12 to the first heat diffusion member 26, flows along the X and Y directions of the first heat diffusion member 26 to be released to the inside of the housing 11, and flows along the Z direction of the first heat diffusion member 26 to be transferred to the back surface panel 16 through the gap G between the first heat diffusion member 26 and the back surface panel 16, and is dissipated from the back surface panel 16 to the outside of the housing 11.

As described above, the heat, which is generated by the antenna modules 12 disposed in the vicinities of the outer peripheral portions of the housing 11 (in the vicinities of the side surface portions 11c), flows toward the inside of the housing 11, whereby the heat is prevented from being directly transferred from the antenna modules 12 to the surface of the housing 11. That is, in the portable electronic device 1, since the paths, through which heat flows from the antenna modules 12, are extended to the inside of the housing 11 and ensured to be long, even when the antenna modules 12 have high temperatures, heat is prevented from being transferred to the housing 11 through paths connecting the antenna modules 12 and the housing 11 at the shortest distances.

In addition, in the portable electronic device 1 according to the first embodiment, heat, which is generated by the integrated circuit 21 on the circuit board 13, is transferred to the chassis member 17, and is transferred to the third heat diffusion member 28 via the support portion 11d of the chassis member 17, as illustrated in FIGS. 3 and 4. The heat, which is transferred from the integrated circuit 21 to the third heat diffusion member 28, flows along the X and Y directions of the third heat diffusion member 28 to be dissipated to the outside of the housing 11, and flows along the Z direction of the third heat diffusion member 28 to be transferred to the liquid crystal display panel 15 to be dissipated from the liquid crystal display panel 15 to the outside of the housing 11.

In addition, in the portable electronic device 1 according to the first embodiment, heat, which is generated by the wireless communication circuit 22 on the circuit board 13, is transferred to the first heat diffusion member 26. The heat, which is transferred from the wireless communication circuit 22 to the first heat diffusion member 26, flows along the X and Y directions of the first heat diffusion member 26 to be released to the inside of the housing 11, and flows along the Z direction of the first heat diffusion member 26 to be transferred to the back surface panel 16 through the gap G between the first heat diffusion member 26 and the back surface panel 16, and is dissipated from the back surface panel 16 to the outside of the housing 11. As described above, in the portable electronic device 1, the heat, which is generated by the wireless communication circuit 22, is released to the inside of the housing 11 by the first heat diffusion member 26, and is prevented from being transferred to the housing 11.

Therefore, as illustrated in FIGS. 3 and 4, the portable electronic device 1 according to the first embodiment has first paths L1 through which the heat, generated by the antenna modules 12 and the wireless communication circuit 22, is diffused to the inside of the housing 11 by the first heat diffusion member 26 and the second heat diffusion members 27. In addition, the portable electronic device 1 has second paths L2 through which the heat, generated by the integrated circuit 21, is diffused to the side surface portions 11c of the housing 11 and the liquid crystal display panel 15 by the third heat diffusion member 28 and the chassis member 17. Since the first paths L1 are separated from the inner surfaces of the housing 11, the housing 11 is prevented from having a high temperature. Regarding the second paths L2, since the distances between the integrated circuit 21 on the circuit board 13 and the side surface portions 11c, are appropriately ensured, the housing 11 is prevented from having a high temperature. In addition, since the paths through which heat generated by the antenna modules 12, the integrated circuit 21, and the wireless communication circuit 22 is transferred, are divided into the first paths L1 and the second paths L2, the flow of heat is dispersed, and transfer of heat to the housing 11 is prevented.

(Effects)

As described above, the portable electronic device 1 according to the first embodiment includes the antenna modules 12, which are disposed in the vicinities of the inner surfaces of the side surface portions 11c in the housing 11 with the gaps G from the inner surfaces of the side surface portions 11c, and the first heat diffusion member 26, which is provided in the housing 11 to be separated from the inner surfaces of the side surface portions 11c and is thermally connected to the antenna modules 12, and the paths through which the heat generated by the antenna modules 12 is transferred along the first heat diffusion member 26, are separated from the inner surfaces of the side surface portions 11c and the main surface portion 11b of the housing 11. As a result, the heat, which is generated by the antenna modules 12 provided in the vicinities of the inner surfaces of the housing 11, can be guided to the inside of the housing 11 by the first heat diffusion member 26, and the heat of the antenna modules 12 is prevented from being transferred to the housing 11 through short paths. In this way, it is possible to prevent the user of the portable electronic device 1 from feeling the heat of the housing 11 at the time of using the portable electronic device 1. As a result, for example, it becomes unnecessary to perform control to restrict the operation of the portable electronic device 1 and finally stop the portable electronic device 1 in order to avoid high temperature of the housing 11 at the time of using the portable electronic device 1.

In addition, in particular, in a case where four antenna modules 12 are provided as in the first embodiment, heat sources that easily transfer the heat of the antenna modules 12 to the housing 11, are disposed at four locations in the housing 11, and thus the effects of the features of the present disclosure are high.

In addition, the portable electronic device 1 according to the first embodiment includes the second heat diffusion members 27, which are provided in the housing 11 to thermally connect the antenna modules 12 and the first heat diffusion member 26. As a result, the antenna modules 12 and the first heat diffusion member 26 can be easily thermally connected via the second heat diffusion members 27 without complicating the shape of the first heat diffusion member 26.

In addition, the portable electronic device 1 according to the first embodiment includes the third heat diffusion member 28, which is provided in the housing 11 and disposed to be separated from the inner surfaces of the side surface portions 11c, and the integrated circuit 21 is thermally connected to the third heat diffusion member 28. As a result, the second paths L2 through which the heat of the integrated circuit 21 is transferred along the third heat diffusion member 28, are provided independently of the first paths L1 through which the heat of the antenna modules 12 is transferred along the first heat diffusion member 26, so that the flow of heat is dispersed, and the transfer of heat to the housing 11 is prevented. In addition, since the heat of the integrated circuit 21 is diffused by the third heat diffusion member 28, the distances between the integrated circuit 21 and the side surface portions 11c are appropriately ensured, so that the housing 11 is prevented from having a high temperature.

In addition, the housing 11 of the portable electronic device 1 according to the first embodiment includes the chassis member 17, in which the one main surface portion 11a of the pair of main surface portions 11a and 11b and the side surface portions 11c are connected, and the third heat diffusion member 28 is provided while being thermally connected to the chassis member 17. As a result, heat transferred to the chassis member 17 can be diffused by the third heat diffusion member 28, and the housing 11 is prevented from having a high temperature.

In addition, in the portable electronic device 1 according to the first embodiment, the wireless communication circuit 22, which is provided on the circuit board 13, is thermally connected to the first heat diffusion member 26. As a result, the heat of the wireless communication circuit 22 can be diffused by using the first heat diffusion member 26 that diffuses the heat of the antenna modules 12.

Hereinafter, other embodiments will be described with reference to the drawings. In other embodiments, the same components and the same structural parts as those in the first embodiment described above are denoted by the same reference numerals as those in the first embodiment, and the descriptions thereof will be omitted.

Second Embodiment

A portable electronic device according to a second embodiment is different from that according to the first embodiment in the position of the third heat diffusion member 28 incorporated in the chassis member 17. FIG. 5 is a cross-sectional view illustrating main parts of the portable electronic device according to the second embodiment, and corresponds to the cross-sectional view taken along line A-A of FIG. 1. As illustrated in FIG. 5, a recessed portion 18, in which the third heat diffusion member 28 is incorporated, is formed in the support portion 11d of the chassis member 17 in a portable electronic device 2 according to the second embodiment so as to face the integrated circuit 21 on the circuit board 13. The integrated circuit 21 is provided so as to be in contact with the third heat diffusion member 28 via an inclusion having thermal conductivity, and the integrated circuit 21 is thermally connected to the third heat diffusion member 28.

(Flow of Heat of Antenna Modules)

In the second embodiment, heat, which is generated by the integrated circuit 21, is transferred to the third heat diffusion member 28. The heat, which is transferred from the integrated circuit 21 to the third heat diffusion member 28, flows along the X and Y directions of the third heat diffusion member 28, is transferred through the chassis member 17, and is dissipated to the outside of the housing 11. In addition, the heat, which is transferred from the integrated circuit 21 to the third heat diffusion member 28, flows along the Z direction of the third heat diffusion member 28, is transferred to the liquid crystal display panel 15 through the support portion 11d of the chassis member 17, and is dissipated from the liquid crystal display panel 15 to the outside of the housing 11.

Also in the second embodiment, similarly to the first embodiment, heat, which is generated by the antenna modules 12 provided in the vicinities of the inner surfaces of the housing 11, can be guided to the inside of the housing 11 by the first heat diffusion member 26, and the heat of the antenna modules 12 can be prevented from being transferred to the housing 11 through short paths.

Third Embodiment

Figure 6:
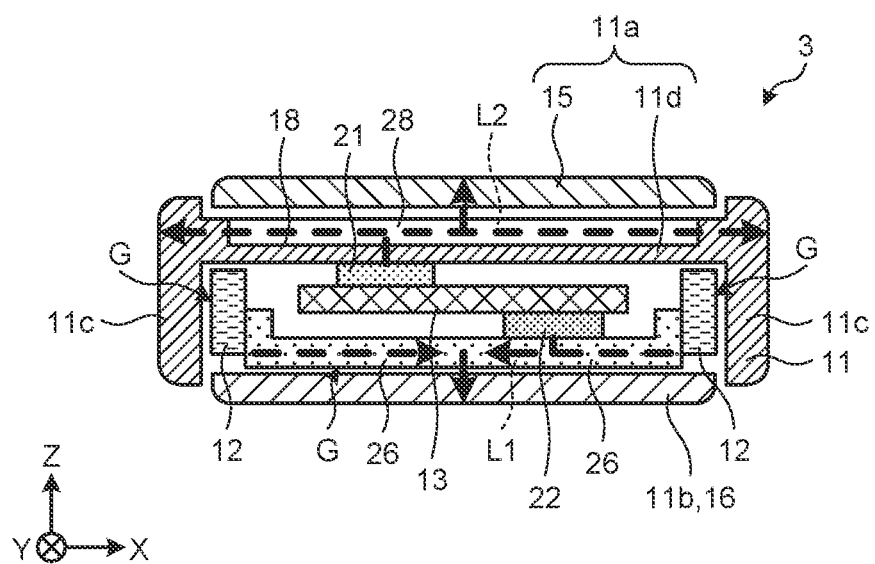
FIG. 6 is a cross-sectional view illustrating main parts of a portable electronic device according to a third embodiment.

A portable electronic device according to a third embodiment is different from that according to the first embodiment in that the antenna modules 12 are directly connected to the first heat diffusion member 26 without using the second heat diffusion members 27. FIG. 6 is a cross-sectional view illustrating main parts of the portable electronic device according to the third embodiment. As illustrated in FIG. 6, the outer peripheral portions of the first heat diffusion member 26 in a portable electronic device 3 according to the third embodiment, are extended to the antenna modules 12 disposed in the vicinities of the inner surfaces of the four side surface portions 11c, and are in contact with the antenna modules 12. Such an outer peripheral portion of the first heat diffusion member 26 is bent in a shape with, for example, an L-shaped cross section and connected to an antenna module 12 to be thermally connected to the antenna module 12.

(Flow of Heat of Antenna Modules)

In the third embodiment, heat, which is generated by the antenna modules 12, is directly transferred to the first heat diffusion member 26. The heat, which is transferred from the antenna modules 12 to the first heat diffusion member 26, flows along the X and Y directions of the first heat diffusion member 26 to be released to the inside of the housing 11, and flows along the Z direction of the first heat diffusion member 26 to be transferred to the back surface panel 16 through the gap G between the first heat diffusion member 26 and the back surface panel 16, and is dissipated from the back surface panel 16 to the outside of the housing 11.

According to the third embodiment, the second heat diffusion members 27 can be omitted. In addition, also in the third embodiment, similarly to the first embodiment, heat, which is generated by the antenna modules 12 provided in the vicinities of the inner surfaces of the housing 11, can be guided to the inside of the housing 11 by the first heat diffusion member 26, and the heat of the antenna modules 12 can be prevented from being transferred to the housing 11 through short paths.

Fourth Embodiment

Figure 7:
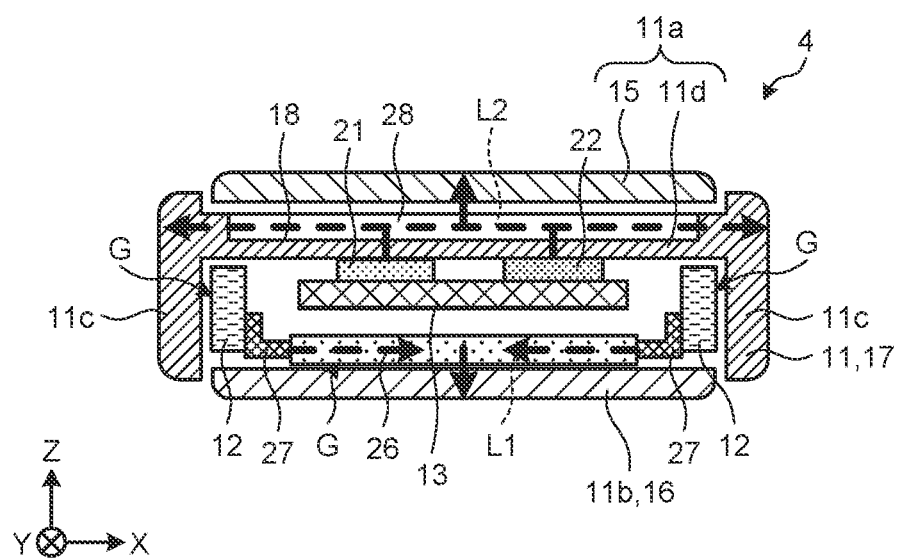
FIG. 7 is a cross-sectional view illustrating main parts of a portable electronic device according to a fourth embodiment.

A portable electronic device according to a fourth embodiment is different from that according to the first embodiment in the arrangement of the wireless communication circuit 22 on the circuit board 13. FIG. 7 is a cross-sectional view illustrating main parts of the portable electronic device according to the fourth embodiment. As illustrated in FIG. 7, in a portable electronic device 4 according to the fourth embodiment, both the integrated circuit 21 and the wireless communication circuit 22 are mounted on the surface side of the circuit board 13 facing the support portion 11d of the chassis member 17.

(Flow of Heat of Antenna Modules)

In the fourth embodiment, heat, which is generated by the integrated circuit 21 and the wireless communication circuit 22, is transferred to the chassis member 17, and is transferred to the third heat diffusion member 28 via the support portion 11d of the chassis member 17. The heat, which is transferred from the integrated circuit 21 and the wireless communication circuit 22 to the third heat diffusion member 28, flows along the X and Y directions of the third heat diffusion member 28 to be dissipated to the outside of the housing 11, and flows along the Z direction of the third heat diffusion member 28 to be transferred to the liquid crystal display panel 15 to be dissipated from the liquid crystal display panel 15 to the outside of the housing 11.

According to the fourth embodiment, for example, in a case where the amount of heat, generated by the antenna modules 12, is large, the first heat diffusion member 26 can be used exclusively for diffusing the heat of only the antenna modules 12. In addition, also in the fourth embodiment, similarly to the first embodiment, heat, which is generated by the antenna modules 12 provided in the vicinities of the inner surfaces of the housing 11, can be guided to the inside of the housing 11 by the first heat diffusion member 26, and the heat of the antenna modules 12 can be prevented from being transferred to the housing 11 through short paths.

Fifth Embodiment

Figure 8:
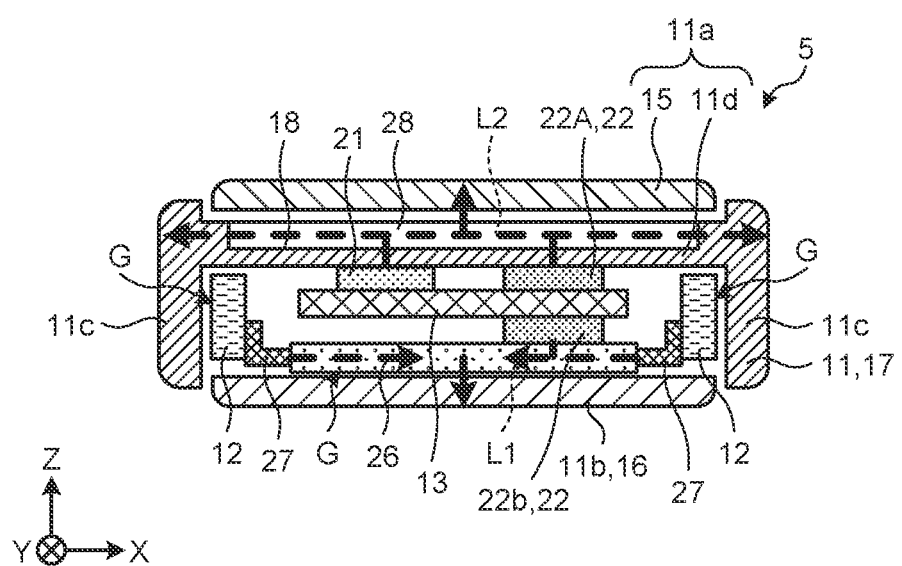
FIG. 8 is a cross-sectional view illustrating main parts of a portable electronic device according to a fifth embodiment.

A portable electronic device according to a fifth embodiment is different from that according to the first embodiment in that the portable electronic device according to the fifth embodiment includes two wireless communication circuits 22. FIG. 8 is a cross-sectional view illustrating main parts of the portable electronic device according to the fifth embodiment. As illustrated in FIG. 8, in a portable electronic device 5 according to the fifth embodiment, the wireless communication circuit 22 is divided into two wireless communication circuits 22A and 22B, and mounted on the front surface (liquid crystal display panel 15 side) and the back surface (back surface panel 16 side) of the circuit board 13, respectively. Similarly to the integrated circuit 21, the one wireless communication circuit 22A is disposed in contact with the support portion 11d of the chassis member 17 via an inclusion having thermal conductivity, and is thermally connected to the third heat diffusion member 28 via the chassis member 17. The other wireless communication circuit 22B is disposed in contact with the first heat diffusion member 26, and is thermally connected to the first heat diffusion member 26.

(Flow of Heat of Antenna Modules)

In the fifth embodiment, heat, which is generated by the one wireless communication circuit 22A, is transferred to the chassis member 17, and is transferred to the third heat diffusion member 28 via the support portion 11d of the chassis member 17. The heat, which is transferred from the wireless communication circuit 22A to the third heat diffusion member 28, flows along the X and Y directions of the third heat diffusion member 28 to be dissipated to the outside of the housing 11, and flows along the Z direction of the third heat diffusion member 28 to be transferred to the liquid crystal display panel 15 to be dissipated from the liquid crystal display panel 15 to the outside of the housing 11. In addition, the heat, which is generated by the other wireless communication circuit 22B, is transferred to the first heat diffusion member 26. The heat, which is transferred from the wireless communication circuit 22B to the first heat diffusion member 26, flows along the X and Y directions of the first heat diffusion member 26 to be released to the inside of the housing 11, and flows along the Z direction of the first heat diffusion member 26 to be transferred to the back surface panel 16 through the gap G between the first heat diffusion member 26 and the back surface panel 16, and is dissipated from the back surface panel 16 to the outside of the housing 11.

According to the fifth embodiment, for example, in a case where the amount of heat, generated by the wireless communication circuit 22, is large, the heat can be diffused by the first heat diffusion member 26 and the third heat diffusion member 28 by dividing the wireless communication circuit 22 into the two wireless communication circuits 22A and 22B. In addition, also in the fifth embodiment, similarly to the first embodiment, heat, which is generated by the antenna modules 12 provided in the vicinities of the inner surfaces of the housing 11, can be guided to the inside of the housing 11 by the first heat diffusion member 26, and the heat of the antenna modules 12 can be prevented from being transferred to the housing 11 through short paths.

Note that the portable electronic device of the present disclosure is not limited to the smartphone of the embodiments, and may be applied to, for example, an information terminal such as a tablet terminal or a wearable terminal worn on the body of the user. Examples of the wearable terminal include a wristwatch-type electronic device and a glasses-type electronic device. The side surface portions of the housing in the present disclosure correspond to, for example, side surface portions of a wristwatch case, ear hook portions of a glasses frame, or side surface portions along a vertical direction in so-called temples.

In addition, although the chassis member 17 according to the present embodiments has the side surface portions 11c and the main surface portion 11a (front surface portion), a structure in which the chassis member has the side surface portions 11c and the main surface portion 11b (back surface portion) or a structure in which the chassis member has the side surface portions 11c and the pair of main surface portions 11a and 11b, may be adopted.

In addition, in the third, fourth, and fifth embodiments described above, the recessed portion 18, in which the third heat diffusion member 28 is incorporated, is formed on the support portion 11d of the chassis member 17 on the liquid crystal display panel 15 side. However, a structure may be adopted in which the recessed portion 18 is formed on the support portion 11d of the chassis member 17 on the circuit board 13 side (back surface panel 16 side) similarly to the second embodiment. In this case, similarly to the second embodiment, the integrated circuit 21 and the wireless communication circuit 22 on the circuit board 13, are thermally connected to the third heat diffusion member 28 without interposing the support portion 11d of the chassis member 17.

Note that the present technique can also adopt the following configurations.

(1) A portable electronic device includes: a housing; an antenna module that is disposed in a vicinity of an inner surface of the housing with a gap from the inner surface; and a first heat diffusion member that is provided in the housing to be separated from the inner surface of the housing and is thermally connected to the antenna module, wherein a path through which heat generated by the antenna module is transferred along the first heat diffusion member, is separated from the inner surface of the housing.

(2) The portable electronic device according to (1), wherein the housing includes a pair of main surface portions and a plurality of side surface portions connecting the pair of main surface portions, the antenna module is disposed in a vicinity of the inner surface of the side surface portions with the gap from the inner surface, and the first heat diffusion member is disposed along one main surface portion of the pair of main surface portions while being separated from the inner surfaces of the pair of main surface portions and the plurality of side surface portions.

(3) The portable electronic device according to (2), further includes a second heat diffusion member provided in the housing and thermally connecting the antenna module and the first heat diffusion member.

(4) The portable electronic device according to (3), further includes: a circuit board that is provided in the housing; a first heat generating element that is provided on the circuit board; and a third heat diffusion member that is provided in the housing and disposed to be separated from the inner surface of the side surface portion, wherein the first heat generating element is thermally connected to the third heat diffusion member.

(5) The portable electronic device according to (4), wherein the housing includes a chassis member in which one main surface portion of the pair of main surface portions and the side surface portion are connected, and the third heat diffusion member is provided while being thermally connected to the chassis member.

(6) The portable electronic device according to (4) or (5), wherein the circuit board is provided with a second heat generating element, and the second heat generating element is thermally connected to the first heat diffusion member.

(7) The portable electronic device according to (2), wherein the plurality of side surface portions of the housing includes two pairs of side surface portions facing each other, and the antenna module is disposed in a vicinity of the inner surface of each surface portion of the two pairs of side surface portions, and an outer peripheral portion of the first heat diffusion member is extended to the antenna module and is in contact with the antenna module.

(8) The portable electronic device according to any one of (1) to (7), wherein a heat insulating material is disposed in the gap.

(9) The portable electronic device according to any one of (1) to (8), wherein the first heat diffusion member is a sheet-like heat dissipation material or a heat dissipation structure.

(10) The portable electronic device according to any one of (1) to (8), wherein the first heat diffusion member is any one member of a graphite sheet, a graphene sheet, a metal plate, a vapor chamber, a heat pipe, and a heat sink, or a member obtained by combining a plurality of the members.

(11) The portable electronic device according to any one of (3) to (6), wherein the second heat diffusion member is a sheet-like heat dissipation material or a heat dissipation structure.

(12) The portable electronic device according to any one of (4) to (6), wherein the third heat diffusion member is a sheet-like heat dissipation material or a heat dissipation structure.

(13) The portable electronic device according to any one of (4) to (6), wherein the third heat diffusion member is any one member of a graphite sheet, a graphene sheet, a metal plate, a vapor chamber, a heat pipe, and a heat sink, or a member obtained by combining a plurality of the members.

REFERENCE SIGNS LIST 1 to 5 PORTABLE ELECTRONIC DEVICE
11 HOUSING
11a, 11b MAIN SURFACE PORTION
11c SIDE SURFACE PORTION
11d SUPPORT PORTION
12 ANTENNA MODULE
13 CIRCUIT BOARD
17 CHASSIS MEMBER
21 INTEGRATED CIRCUIT (FIRST HEAT GENERATING ELEMENT)
22 WIRELESS COMMUNICATION CIRCUIT (SECOND HEAT GENERATING ELEMENT)
26 FIRST HEAT DIFFUSION MEMBER
27 SECOND HEAT DIFFUSION MEMBER
28 THIRD HEAT DIFFUSION MEMBER
G GAP

The invention claimed is:

1. A portable electronic device, comprising:
a housing that includes:
a pair of main surface portions, wherein
a first main surface portion of the pair of main surface portions includes a support portion that supports a display panel;
a chassis member that includes a recessed portion;
a first heat generating element;
an antenna module in a vicinity of an inner surface of the housing, wherein a gap is present between the antenna module and the inner surface of the housing;
a first heat diffusion member in the housing, wherein
the first heat diffusion member is separated from the inner surface of the housing,
the first heat diffusion member is thermally connected to the antenna module, and
a path through which heat generated by the antenna module is transferred along the first heat diffusion member is separated from the inner surface of the housing; and
a third heat diffusion member in the recessed portion of the chassis member, wherein
the third heat diffusion member is in thermal contact with an inner surface of the recessed portion,
the third heat diffusion member is separated from the inner surface of the housing, and
heat generated by the first heat generating element is transferred to the third heat diffusion member via the support portion of the chassis member.

2. The portable electronic device according to claim 1, wherein
the housing further includes a plurality of side surface portions that connect the pair of main surface portions,
the antenna module is in a vicinity of an inner surface of the plurality of side surface portions with the gap between the antenna module and the inner surface of the housing, and
the first heat diffusion member is along the first main surface portion of the pair of main surface portions and is separated from an inner surface of the pair of main surface portions and the inner surface of the plurality of side surface portions.

3. The portable electronic device according to claim 2, further comprising
a second heat diffusion member in the housing, wherein the second heat diffusion member thermally connects the antenna module and the first heat diffusion member.

4. The portable electronic device according to claim 2, wherein the plurality of side surface portions of the housing includes two pairs of side surface portions that faces each other, the antenna module is in a vicinity of an inner surface of each surface portion of the two pairs of side surface portions, and an outer peripheral portion of the first heat diffusion member is extended to the antenna module and is in contact with the antenna module.

5. The portable electronic device according to claim 3, further comprising a circuit board in the housing, wherein
the first heat generating element is on the circuit board, and
the first heat generating element is thermally connected to the third heat diffusion member.

6. The portable electronic device according to claim 3, wherein the second heat diffusion member is one of a sheet-like heat dissipation material or a heat dissipation structure.

7. The portable electronic device according to claim 5, wherein the first main surface portion of the pair of main surface portions and the plurality of side surface portions are connected in the chassis member.

8. The portable electronic device according to claim 5, further comprising a second heat generating element on the circuit board, wherein the second heat generating element is thermally connected to the first heat diffusion member.

9. The portable electronic device according to claim 1, wherein a heat insulating material is disposed in the gap.

10. The portable electronic device according to claim 1, wherein the first heat diffusion member is one of a sheet-like heat dissipation material or a heat dissipation structure.

11. The portable electronic device according to claim 1, wherein the first heat diffusion member is at least one of a graphite sheet, a graphene sheet, a metal plate, a vapor chamber, a heat pipe, or a heat sink.

12. The portable electronic device according to claim 1, wherein the third heat diffusion member is one of a sheet-like heat dissipation material or a heat dissipation structure.

13. The portable electronic device according to claim 1, wherein the third heat diffusion member is at least one of a graphite sheet, a graphene sheet, a metal plate, a vapor chamber, a heat pipe, or a heat sink.

* * * * *